United States Patent [19]

Nakayama et al.

[11] Patent Number: 4,740,693

[45] Date of Patent: Apr. 26, 1988

[54] ELECTRON BEAM PATTERN LINE WIDTH MEASUREMENT SYSTEM

[75] Inventors: Yoshinori Nakayama, Sayama; Shinji Okazaki, Urawa, both of Japan; Hidehito Obayashi, Burlingame, Calif.; Mikio Ichihashi, Kodaira, Japan

[73] Assignee: Hitachi, Ltd., Tokyo, Japan

[21] Appl. No.: 807,681

[22] Filed: Dec. 11, 1985

[30] Foreign Application Priority Data

Dec. 14, 1984 [JP] Japan ................. 59-262678

[51] Int. Cl.$^4$ .................. G01B 7/14; G01B 15/00
[52] U.S. Cl. .................... 250/305; 250/397
[58] Field of Search ........... 250/491.1, 492.2, 492.3, 250/397, 398, 399, 306, 307, 310, 305

[56] References Cited

U.S. PATENT DOCUMENTS

| 4,139,774 | 2/1979 | Katagiri | 250/441 |
| 4,179,604 | 12/1979 | Christou | 250/305 |
| 4,264,822 | 4/1981 | Ueno et al. | 250/492.2 |
| 4,567,364 | 1/1986 | Kano et al. | 250/307 |
| 4,600,839 | 7/1986 | Ichihashi et al. | 250/310 |

FOREIGN PATENT DOCUMENTS

| 0279943 | 3/1970 | Austria . | |
| 0138790 | 12/1978 | Japan | 250/305 |
| 57-96207 | 6/1982 | Japan . | |
| 0033040 | 2/1985 | Japan | 250/305 |

OTHER PUBLICATIONS

P. R. Thorton, "Scanning Electron Microscopy," 1968, pp. 104–105, Chapman and Hall, London, GB.

Stupian et al., "Auger Microscopy Using Sample Modulation," Rev. of Sci. Inst., vol. 55, No. 1, JA 1984, pp. 92–94.

Davis et al., "E-Beam Line Width and Pattern Location Measurement Tool," IBM Tech. Disc. Bull., vol. 21, No. 1, Je 1978.

*Primary Examiner*—Bruce C. Anderson
*Assistant Examiner*—Paul A. Guss
*Attorney, Agent, or Firm*—Antonelli, Terry & Wands

[57] ABSTRACT

Disclosed is an electron beam pattern line width measurement system wherein an electron beam is converged to a fine spot, the electron beam is scanned on a sample formed with a pattern to-be-measured, secondary electrons generated from a surface of the sample by the projection of the electron beam are detected, and the detected signal is processed to determine a line width of the pattern to-be-measured, comprising a secondary electron detector which detects a signal corresponding to an amount of all secondary electrons generated by the scanning, and a secondary electron energy analyzer which selectively detects a signal corresponding to an amount of secondary electrons of specified energy. With the electron beam pattern line width measurement system, it becomes possible to precisely detect a pattern boundary region defined by different sorts of materials in a stepped structure of a small level difference not having been measurable with a prior-art electron beam pattern line width measurement system.

6 Claims, 3 Drawing Sheets

ELECTRON BEAM PATTERN LINE WIDTH MEASUREMENT SYSTEM

BACKGROUND OF THE INVENTION

The present invention relates to an electron beam pattern line width measurement system which measures the line width of a fine pattern such as wiring formed on the surface of a semiconductor substrate, by the use of an electron beam. More particularly, it relates to an electron beam pattern line width measurement system which is well-suited to measure the line width of a pattern on a sample surface made of a plurality of different materials.

A prior-art example which uses a electron beam to detect the amount of secondary electrons and to measure the line width of a pattern, is described in "Ishida et al; Simulation of electron signal waveform on microdimensional line width measurement, 1980, Proceedings of the 41st Autumn Meeting of the Japan Society of Applied Physics, page 324, 17a-F-2". This example evaluates the line width of the pattern of a W (tungsten) gate 24 formed on an Si (silicon) substrate 23 as shown in FIG. 1, under the assumption that each signal corresponding to an edge portion 26, in a secondary electron signal 25 obtained by scanning an electron beam on the surface of the substrate, corresponds to the edge shape of the W gate 24. In the Ishida et al literature, the line width of the pattern is determined from only the signal corresponding to the amount of secondary electrons generated from the sample. In the case of FIG. 1, the W gate 24 is thick enough to afford a good edge shape, and the sectional shape of the sample substrate is known, so that the edge signals could be read from the secondary electron signal. However, it is not always the case that the conditions mentioned above are satisfied. Rather, it is common that there is no considerable difference between a secondary electron signal level corresponding to an Si substrate and a signal level corresponding to a W gate when the W gate is thinned more with rise in the integration density of an electron device. Moreover, in a nondestructive sample measurement, a sectional structure is usually unclear. In such cases, it is difficult to separate the edge signals from the secondary electron signal. The upper part 21 of FIG. 1 shows the sectional structure of the substrate, while the lower part 22 is a graph showing the amounts of secondary electrons versus the various positions of the sectional structure shown in the upper part 21.

Meanwhile, it is known that information specific to a substance is contained in the energy distribution of secondary electrons [refer to, for example, "Ogawa et al; A measurement of secondary electrons by Auger microprobe, 1984, Proceedings of the 31st Spring Meeting of the Japan Society of Applied Physics and of the Related Societies, page 291, 29p-x-10"]. It is known that, in general, the secondary electron energy distribution of insulators including semiconductors and the secondary electron energy distribution of metals exhibit a distinction as shown in FIG. 2 [refer to P. R. Thornton; "Scanning Electron Microscopy", pp. 104–105, 1968, published by Chapman and Hall Ltd., in London, Great Britain]. That is, the secondary electron energy distribution of a semiconductor is narrower than that of a metal, and the secondary electron energy of the semiconductor at a position 35 at which the secondary electron emission yield $\sigma$ becomes the maximum is 2.5–5 eV, which are smaller than that of the metal being 5–10 eV at the corresponding position 36. In FIG. 2, curves 31, 32, 33 and 34 correspond to the secondary electrons of insulator materials encompassing semiconductors, the secondary electrons of metals, the reflected electrons of the insulator materials encompassing the semiconductors, and the reflected electrons of the metals, respectively.

SUMMARY OF THE INVENTION

An object of the present invention is to eliminate the difficulties of the prior-art electron beam pattern line width measurement system described above, and to provide an electron beam pattern line width measurement system which detects, not only the stepped portion of a sample surface, but also the boundary defined by different substances, irrespective of the presence or absence of a level difference, whereby the line width of a pattern to be measured can be precisely evaluated.

In order to accomplish the object, the electron beam pattern line width measurement system of the present invention *consists,* in a well-known electron beam pattern line width measurement system wherein an electron beam is converged to a fine spot, the electron beam is scanned on a sample formed with a pattern to-be-measured, secondary electrons generated from a surface of the sample by the projection of the electron beam are detected, the relation between the intensity of the detected signal and a position irradiated with the electron beam is found, and a line width of the pattern to-be-measured is determined from the relation, in comprising a secondary electron detector which detects a signal corresponding to an amount of all secondary electrons generated by the scanning, and a secondary electron energy analyzer which selectively detects a signal corresponding to an amount of secondary electrons of specified energy.

Furthermore a signal processor for knowing the relation between the intensity of the secondary electron detection signal and the electron beam irradiation position, which consists of an amplifier, an oscillograph etc. as required, is connected to the secondary electron detector and the secondary electron energy analyzer.

Since, as described above, the electron beam pattern line width measurement system of the present invention comprises the secondary electron energy analyzer, the differences of the energy distribution of secondary electrons depending upon substances can be detected as information, and even a boundary in a sample surface defined by different substances can be detected irrespective of the presence or absence of a level difference. The system of the present invention can accordingly measure a pattern line width much more precisely than the prior art by combining the signal detection of the amount of secondary electrons from the stepped portion of a fine pattern, for example, formed on a semiconductor substrate and the detection of the difference of secondary electron energy distributions based on different substances.

As described above, the secondary electron energy with which the maximum secondary electron emission yield is attained is 2.5–5 eV for semiconductors and 5–10 eV for metals. Therefore, when the system of the present invention is applied to a case where a metallic pattern exists on the surface of a semiconductor substrate, the position of the boundary of the substances can be separated and discriminated by detecting the amount of secondary electrons whose energies are, for example, near 10 eV or above about 10 eV. On the contrary, with the prior-art system exemplified in FIG. 1, the total number of secondary electrons of various energies is measured, hence, the distinction based on substances as stated above is not reflected.

That is, with the electron beam pattern line width measurement system of the present invention, a stepped pattern in a sample surface is measured by the secondary electron detector, a pattern formed of a different sort of substance is measured by the secondary electron energy analyzer, and a pattern having a level difference at the boundary between different sorts of substances is measured by both of the above devices. The secondary electron detector is necessary for the measurement of the stepped pattern made of an identical substance.

As described before, the interaction between an electron beam and a substance is reflected upon the amount of secondary electrons and the energy distribution thereof, and especially, information specific to the substance is contained in the energy distribution of the secondary electrons. In the prior-art pattern line width measurement employing an electron beam, only the change of the amount of all secondary electrons from a substance making up a pattern is utilized, hence, the detection of a substance difference has been unclear. On the contrary, the present invention measures the energy distribution of secondary electrons and detects also a signal specific to a substance, thereby making it possible to detect a pattern boundary even for a pattern having a small level difference at a step.

It is common to employ a well-known scintillation counter having a photomultiplier as the secondary electron detector which detects a signal corresponding to the amount of all secondary electrons, and a well-known cylindrical mirror analyzer (in general, abbreviated to 'CMA') as the secondary electron energy analyzer which selectively detects a signal corresponding to the amount of secondary electrons of specified energy. However, they are not restrictive, and any devices usable for the same measurement purposes may be employed.

The secondary electron detector and the secondary electron energy analyzer may be disposed likewise to the case of disposing the secondary electron detector in the prior-art electron beam pattern line width measurement system. That is, they may be disposed at positions and with attitudes according to which they can receive secondary electrons.

The scanning of the electron beam is done by moving the electron beam or the sample.

DESCRIPTION OF THE PREFERRED EMBODIMENTS

Figure 1:
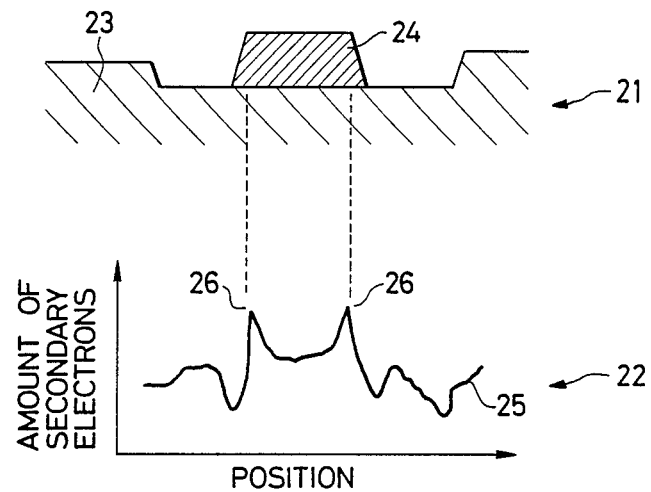
FIG. 1 is a view for explaining a prior-art method of measuring the line width of a fine pattern.
Figure 2:
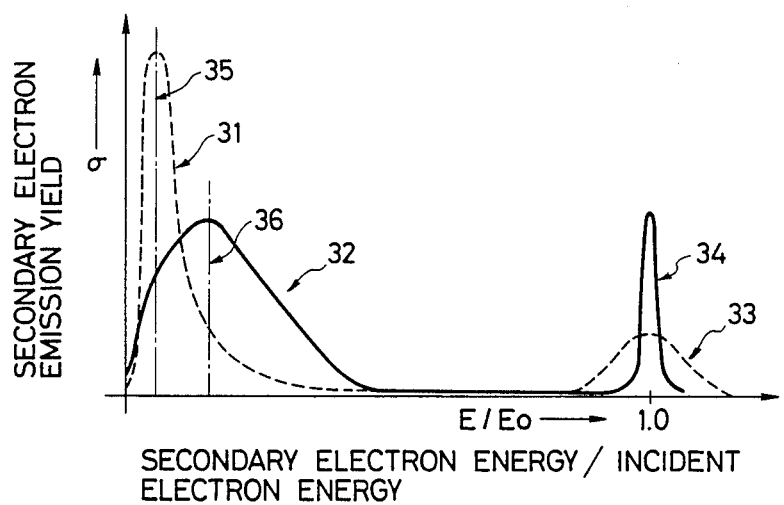
FIG. 2 is a graph showing the relationship of the secondary electron emission yield versus the ratio between secondary electron energy and incident electron energy.
Figure 3:
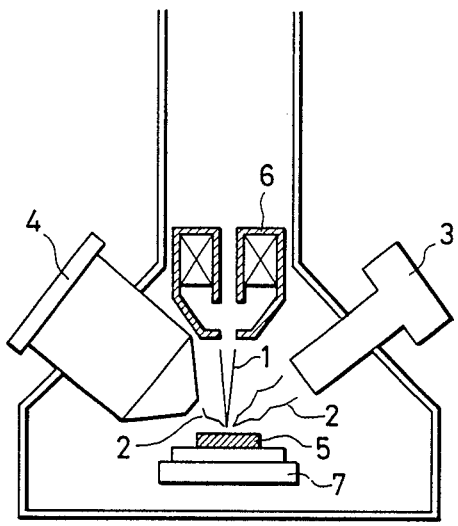
FIG. 3 is a schematic view showing an electron beam line width measurement system which is an embodiment of the present invention.
Figure 4:
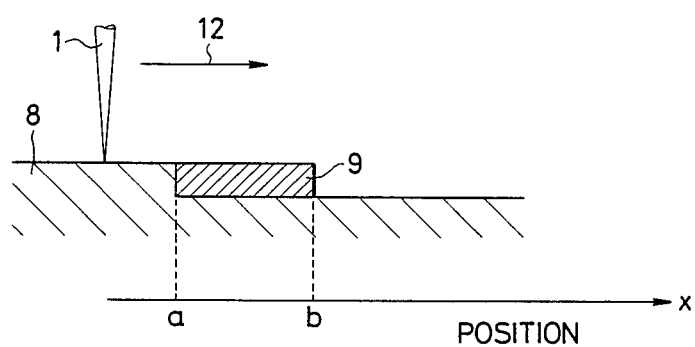
FIG. 4 is an explanatory sectional view of a sample to-be-measured in an example of the present invention.
Figure 5:
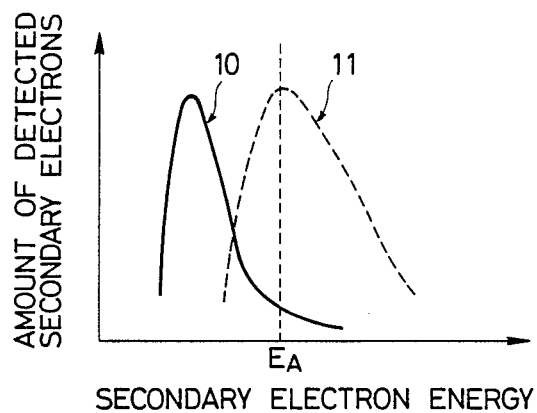
FIG. 5 is a graph showing secondary electron energy distribution in the example of the present invention.
Figure 6:
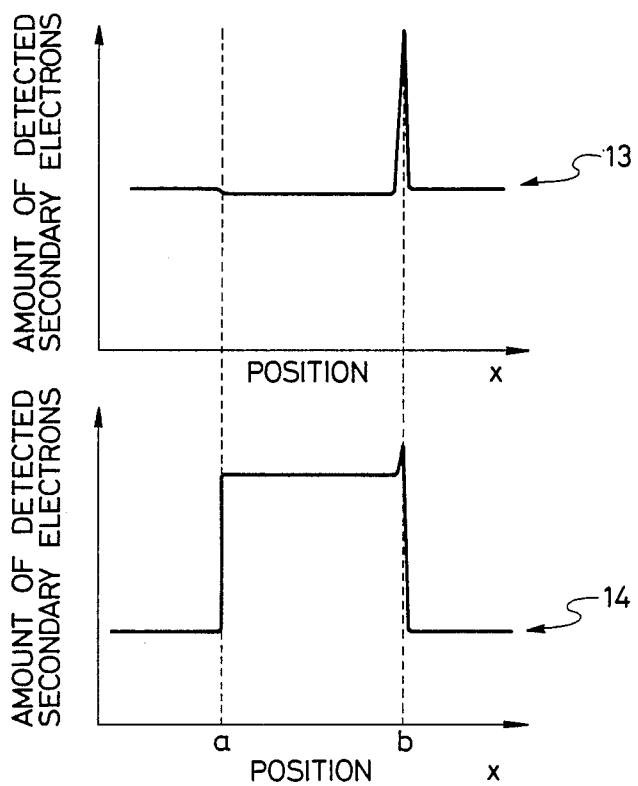
FIG. 6 shows graphs of the relationships between the electron beam irradiation position of the sample to-be-measured and the amounts of detected secondary electrons in the example of the present invention.

Now, an embodiment of the present invention will be described with reference to FIGS. 3-6. FIG. 3 is a schematic view showing the arrangement of the electron beam pattern line width measurement system of this embodiment, FIG. 4 is an explanatory sectional view of a sample to-be-measured, FIG. 5 is a diagram of the energy distributions of secondary electrons from the sample substrate and from a pattern (a thin metal film as an electrode) on the substrate, and FIG. 6 shows graphs of the relationships between the electron beam irradiation position of a sample surface and the amounts of detected secondary electrons, the upper part 13 of which has been obtained with a secondary electron detector 3 and the lower part 14 of which has been obtained with a secondary electron energy analyzer 4. Throughout FIGS. 3-6, symbols are common.

In the system of FIG. 3, using an objective lens 6, an electron beam 1 is finely converged onto a sample to-be-measured 5 which is formed with a pattern to-be-measured. Secondary electrons 2 generated in consequence of the projection of the electron beam are detected by the secondary electron detector 3 and the secondary electron energy analyzer 4 so as to measure pattern positions on the basis of the signal fluctuations thereof. In an example of this embodiment, a scintillation counter having a photomultiplier was used as the secondary electron detector 3, and a cylindrical mirror analyzer (CMA) was used as the secondary electron energy analyzer 4. Numeral 7 in FIG. 3 designates a sample translation stage.

Next, the operation of the present invention will be described with reference to FIGS. 4-6. Let's consider a case where a pattern to be measured is a thin metal film of an electrode 9 made of, e.g., W and formed on a semiconductor substrate 8 made of, e.g., Si and where the electron beam 1 is scanned in the direction of an arrow 12 as illustrated in FIG. 4. When the line width a-b of the sample having almost no level difference at a position a of the boundary of different substances and having a level difference of about 1 μm only at a position b is measured, the step of the position b is detected from a detection signal corresponding to the amount of generation of secondary electrons (the prior art can obtain only this signal) as shown at 13 in FIG. 6, but the boundary cannot be detected at the position a if the difference of the secondary electron emission yields depending upon the substances is small. Next, when the energies of the secondary electrons are analyzed by the secondary electron energy analyzer 4 to obtain energy distribution curves, peaks and absorption specific to the substances are observed as shown in FIG. 5. In FIG. 5, a curve 10 is the energy distribution curve of the secondary electrons from the semiconductor substrate 8 in FIG. 4, and a broken-line curve 11 is the energy distribution curve of the secondary electrons from the thin metal film of the electrode 9 in FIG. 4. Thus, when note is taken of a secondary electron energy value $E_A$ at a position at which the peak of the energy distribution curve 11 of the secondary electrons from the thin metal film of the electrode 9 appears and secondary electrons whose energy values are $E_A$ and above are detected by the secondary electron energy analyzer 4, the detection of the substance boundary position a not having been detectible with the prior-art method becomes possible and accurate positional information is obtained as illustrated at 14 in FIG. 6.

The secondary electron energy analyzer 4 is not restricted only to the CMA employed in this embodiment, but a measuring instrument in which a grid electrode to serve as an energy filter is disposed in front of a secondary electron detector can produce the same effect as that of the CMA as is well known.

In the above embodiment, the secondary electron energy distribution curves of the respective materials constituting the surface of the sample substrate are obtained to determine the energy value $E_A$ of the secondary electrons which are to be detected by the secondary electron energy analyzer, whereupon the electron beam is scanned on the sample surface to obtain the data of the amounts of detected secondary electrons at the respective positions as shown in FIG. 6. However, in a case where the materials constituting the sample surface are known in advance and where the secondary electron energy value $E_A$ is also known, the relations between the position of the sample surface and the amounts of detected secondary electrons as shown in FIG. 6 may be found by the use of the known value $E_A$ without obtaining the secondary electron energy distribution curves as shown in FIG. 5.

In order to synthetically measure the line widths of a stepped pattern made of an identical material and a pattern defined by different sorts of materials, a graph corresponding to the graph 13 in FIG. 6 obtained with the secondary electron detector 3 and a graph corresponding to the graph 14 in FIG. 6 obtained with the secondary electron energy analyzer 4 should desirably have the axes of abscissas indicative of positions taken in the same unit so that both the graphs can be readily compared with each other.

According to the present invention, it becomes possible to precisely detect a pattern boundary region defined by different sorts of materials in a stepped portion of a small level difference and accordingly to measure the line width of a pattern structure not having been measurable with the detection signal corresponding to the amount of generated secondary electrons in the prior-art method. The effect of the present invention is advantageous for the reasons that each of most fine patterns in semiconductor processes is defined by a plurality of different substances, and that a pattern step becomes smaller and smaller with the microminiaturization of semiconductor devices.

Incidentally, in the electron beam pattern line width measurement system of the present invention, conventional knowledge and known teachings may be adopted in connection with matters not specifically described in the instant specification.

What is claimed is:

1. An electron beam pattern line width measurement system wherein an electron beam is converged to a fine spot, the electron beam is scanned on a sample formed with a pattern to-be-measured, secondary electrons generated from a surface of the sample by the projection of the electron beam are detected, and the detected signal is processed to determine a line width of the pattern to-be-measured comprising:
   a secondary electron detector which detects a signal corresponding to an amount of all secondary electrons generated by the scanning electron beam to detect stepped portions of the sample,
   a secondary electron energy analyzer which selectively detects a signal corresponding to an amount of secondary electrons having a specified energy to detect substance changes in the sample and,
   a signal processor, including display means for enabling simultaneous comparison of a first graph showing the relation between the intensity of the seconday electron detection signal measured by said secondary electron detector and the electron beam irradiation position and a second graph showing the relation between the intensity of the secondary electron detection signal measured by said secondary electron energy analyzer and the electron beam irradiation position.

2. An electron beam pattern line width measurement system according to claim 1, wherein said secondary electron energy analyzer is a cylindrical mirror analyzer.

3. An electron beam pattern line width measurement system according to claim 1, wherein said secondary electron energy analyzer is a secondary electron detector in front of which a grid electrode serving as an energy filter is disposed.

4. An electron beam pattern line width measurement system according to claim 1, wherein said secondary electron detector is a scintillation counter.

5. An electron beam pattern line width measurement system according to claim 2, wherein said secondary electron detector is a scintillation counter.

6. An electron beam pattern line width measurement system according to claim 1, wherein said display means includes means for displaying said first and second graphs in alignment in corresponding units so that positions along the abscissas of said first and second graphs can be readily compared.

* * * * *